(12) United States Patent
Philippens et al.

(10) Patent No.: US 9,882,160 B2
(45) Date of Patent: Jan. 30, 2018

(54) OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Marc Philippens, Regensburg (DE); Michael Fehrer, Bad Abbach (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 15/030,875

(22) PCT Filed: Oct. 24, 2014

(86) PCT No.: PCT/EP2014/072856
§ 371 (c)(1),
(2) Date: Apr. 21, 2016

(87) PCT Pub. No.: WO2015/059278
PCT Pub. Date: Apr. 30, 2015

(65) Prior Publication Data
US 2016/0248038 A1    Aug. 25, 2016

(30) Foreign Application Priority Data

Oct. 25, 2013  (DE) .................. 10 2013 111 785

(51) Int. Cl.
*H01L 51/52* (2006.01)
*H01L 51/00* (2006.01)
(Continued)

(52) U.S. Cl.
CPC ........ *H01L 51/5209* (2013.01); *H01L 23/544* (2013.01); *H01L 27/3239* (2013.01);
(Continued)

(58) Field of Classification Search
CPC ............ H01L 51/5209; H01L 51/5218; H01L 51/5265; H01L 51/5268; H01L 51/5271
See application file for complete search history.

(56) References Cited

U.S. PATENT DOCUMENTS

2004/0012980 A1* 1/2004 Sugiura ............... H01L 51/5262
                                                    362/560
2005/0127334 A1* 6/2005 Shibata ................... H01J 1/304
                                                    252/502
(Continued)

FOREIGN PATENT DOCUMENTS

CN          1769066 A      5/2006
DE    102007054037 A1      4/2009
(Continued)

OTHER PUBLICATIONS

International Search Report based on Application No. PCT/EP2014/072856 (5 pages and 3 pages of English translation) dated Apr. 1, 2015 (Reference Purpose Only).
(Continued)

*Primary Examiner* — Bryan Junge
(74) *Attorney, Agent, or Firm* — Viering, Jentschura & Partner mbB

(57) ABSTRACT

In various embodiments, an optoelectronic component is provided. The optoelectronic component may include an electrode, and an organic functional layer structure formed for emitting an electromagnetic radiation or converting an electromagnetic radiation into an electric current. The electrode has a surface which is reflective with respect to the electromagnetic radiation, and wherein the organic functional layer structure is formed on or over the reflective surface of the electrode and is electrically coupled thereto. The reflective surface has a structuring.

12 Claims, 8 Drawing Sheets

(51) Int. Cl.
*H01L 51/44* (2006.01)
*H01L 27/32* (2006.01)
*H01L 23/544* (2006.01)
*H01L 51/56* (2006.01)

(52) U.S. Cl.
CPC ........ *H01L 51/0023* (2013.01); *H01L 51/441* (2013.01); *H01L 51/5218* (2013.01); *H01L 51/5225* (2013.01); *H01L 51/5262* (2013.01); *H01L 51/5271* (2013.01); *H01L 51/56* (2013.01); H01L 2223/5442 (2013.01); H01L 2223/54406 (2013.01); H01L 2251/5361 (2013.01); Y02E 10/549 (2013.01); Y02P 70/521 (2015.11)

(56) References Cited

U.S. PATENT DOCUMENTS

| | | | |
|---|---|---|---|
| 2006/0084006 A1 | 4/2006 | Kang et al. | |
| 2009/0097234 A1 | 4/2009 | von Malm | |
| 2010/0052518 A1* | 3/2010 | Jeon | H01L 51/5203 313/504 |
| 2010/0141612 A1* | 6/2010 | Desieres | H01L 51/5206 345/204 |
| 2011/0114931 A1* | 5/2011 | Lee | H01L 51/5262 257/40 |
| 2011/0151607 A1 | 6/2011 | Landis et al. | |
| 2012/0104440 A1* | 5/2012 | Peng | H01L 33/007 257/98 |
| 2012/0244322 A1* | 9/2012 | Morhard | C23C 18/1603 428/172 |
| 2013/0329176 A1* | 12/2013 | Kuniyoshi | G02F 1/1368 349/138 |
| 2014/0001450 A1* | 1/2014 | Shinotsuka | H01L 51/5225 257/40 |
| 2015/0034925 A1* | 2/2015 | Shinotsuka | H01L 51/5218 257/40 |
| 2015/0251917 A1* | 9/2015 | Hong | B81C 1/00031 216/24 |

FOREIGN PATENT DOCUMENTS

| | | | | |
|---|---|---|---|---|
| EP | 1997166 B1 | 7/2010 | | |
| EP | 2637480 A1 | 9/2013 | | |
| WO | 2013061237 A1 | 5/2013 | | |
| WO | WO 2013061237 A1 * | 5/2013 | ......... | H01L 27/3239 |
| WO | 2013099915 A1 | 7/2013 | | |

OTHER PUBLICATIONS

German Search Report based on Application No. 10 2013 111 785.6 (7 pages) dated Oct. 24, 2014 (Reference Purpose Only).
Chinese Office Action based on application No. 201480058716.5 (7 pages and 5 pages of English translation) dated Nov. 14, 2016 (Reference Purpose Only).
Chinese Office Action based on application No. 201480058716.5 (7 pages and 9 pages of English translation) dated Jul. 11, 2017 (Reference Purpose Only).

\* cited by examiner

FIG 4
FIG 4A
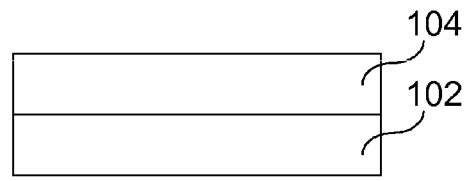
FIG 4B
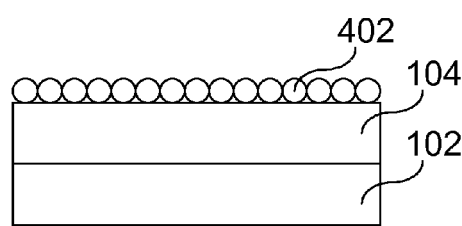
FIG 4C
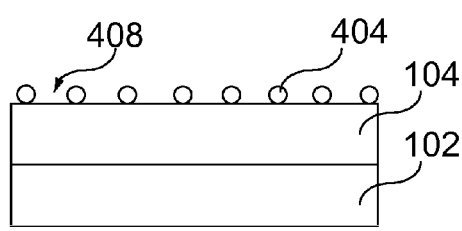
FIG 4D
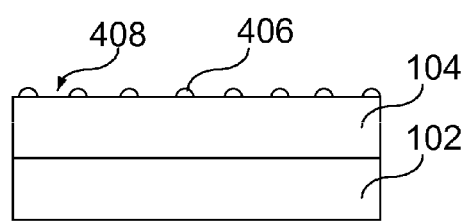

FIG 8
FIG 8A
FIG 8B
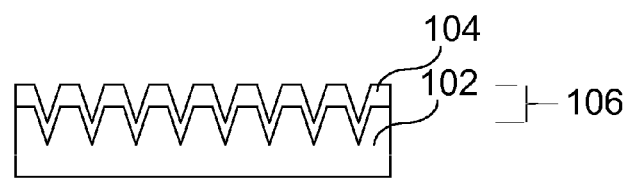

OPTOELECTRONIC COMPONENT AND METHOD FOR PRODUCING AN OPTOELECTRONIC COMPONENT

RELATED APPLICATIONS

The present application is a national stage entry according to 35 U.S.C. § 371 of PCT application No.: PCT/EP2014/072856 filed on Oct. 24, 2014, which claims priority from German application No.: 10 2013 111 785.6 filed on Oct. 25, 2013, and is incorporated herein by reference in its entirety.

TECHNICAL FIELD

In various embodiments, an optoelectronic component and a method for producing an optoelectronic component are provided.

BACKGROUND

Optoelectronic components on an organic basis, for example organic light emitting diodes (OLEDs), are being increasingly widely used in general lighting, for example as a surface light source.

An organic optoelectronic component, for example an OLED, may include an anode or a cathode with an organic functional layer system therebetween. The organic functional layer system may include one or a plurality of emitter layer(s) in which electromagnetic radiation is generated, one or a plurality of charge generating layer structure(s) each composed of two or more charge generating layers (CGL) for charge generation, and one or a plurality of electron blocking layer(s), also designated as hole transport layers (s) (HTL), and one or a plurality of hole blocking layer(s), also designated as electron transport layer(s) (ETL), in order to direct the current flow.

Hitherto, in the case of organic light emitting diodes there have been two approaches for increasing the coupling-out of light: external coupling-out and internal coupling-out.

External coupling-out can be understood to mean devices used to increase the proportion of light which is coupled out from the substrate into emitted light. Such a device can be for example a film including scattering particles or a surface structuring, for example microlenses. The film can be applied to the outer side of the substrate, for example. Further possibilities may be a direct structuring of the outer side of the substrate or the introduction of scattering particles into the substrate, for example into the glass substrate. Some of these approaches, for example the scattering film, have already been used in OLED lighting modules or the high scalability thereof has been demonstrated. However, external coupling-out can have two significant disadvantages. In the case of external coupling-out, the coupling-out efficiency may be limited to approximately 60% to approximately 70% of the light guided in the substrate. Furthermore, the appearance of the organic light emitting diode may be significantly influenced in the case of measures for external coupling-out. By means of the applied layers or films, for example, a surface which is milky in its appearance and/or diffusely reflective may be formed in the organic light emitting diode.

Internal coupling-out can be understood to mean devices in which light is coupled out which is guided in the electrically active region of the organic light emitting diode, for example in the organic functional layer system and/or the transparent electrodes. In a conventional device for the internal coupling-out of light, a grating having a low refractive index can be applied on or over one of the electrodes of the optoelectronic component, for example an electrode composed of indium tin oxide (ITO). The grating includes structured regions including a material having a low refractive index. In a further conventional device for the internal coupling-out of light, a scattering layer can be applied above or on a transparent electrode, for example an indium tin oxide anode. The scattering layer includes a matrix composed of a polymer, in which scattering centers are distributed. The matrix has a refractive index of approximately 1.5 and the scattering centers have a higher refractive index than the matrix.

Internal coupling-out arrangements on the second electrode have the disadvantage that they are formed only at the end of the value creating chain, that is to say after the organic functional layer system has been formed between the first electrode and the second electrode. Conventional coupling-out arrangements in which the first electrode is formed on the coupling-out structure have the disadvantage that these internal coupling-out structures are complicated to produce and/or can adversely affect the durability of the component.

SUMMARY

In various embodiments, an optoelectronic component and a method for producing an optoelectronic component are provided which make it possible to obtain an increased coupling-in of light and/or coupling-out of light for optoelectronic components, for example for organic light emitting diodes. Furthermore, as a result, the coupling-out can be formed before the organic functional layer structure, and thus early in the value creating process. If the coupling-out is not effective, it can be rejected with relatively low preceding financial outlay.

In various embodiments, an optoelectronic component is provided, the optoelectronic component including: an electrode; and an organic functional layer structure formed for emitting an electromagnetic radiation or converting an electromagnetic radiation into an electric current; wherein the electrode has a surface which is reflective with respect to the electromagnetic radiation, and wherein the organic functional layer structure is formed on or over the reflective surface of the electrode and is electrically coupled thereto; and wherein the reflective surface has a structuring.

In various configurations, the electrode may include or be formed from a metal, for example as a metal coating, metallization layer or a transparent electrically conductive coating, for example composed of a transparent electrically conductive oxide (transparent conductive oxide), for example hole-conducting (p-TCO) or electron-conducting (n-TCO).

In various configurations, the optoelectronic component can furthermore include a carrier, wherein the electrode is formed on or over the carrier. The carrier can be intrinsically hermetically impermeable with respect to water and/or oxygen or include a barrier layer.

In various configurations, the carrier can have a substantially (apart from an intrinsic roughness of the surface of the carrier) plane, unstructured surface and the electrode can have an interface which is substantially conformal with respect to the surface of the carrier, i.e. plane, and unstructured, on the side of the carrier. In this case, a conformally formed electrode can be understood to mean a substantially plane-parallel reproduction of the interface of the electrode in the direction of the carrier with respect to the topography of the carrier. In other words: in various developments, the structured electrode includes a first region and a second region. The first region can be connected to the carrier or face the latter. The second region has the reflective surface with structuring, on or over which the organic functional layer structure is formed. The structuring is formed in such a way that the absolute value of the area of the second region is greater than the absolute value of the area of the first region. As a result, the structuring of the electrode can have a lens effect with respect to the surface of the carrier and the absolute value of the area of the optically active side can be increased, i.e. the absolute value of lumens per unit area of an OLED can be increased for the same area of the carrier according to the absolute value of the area of the second region, without the lifetime of the OLED being reduced.

Alternatively, the carrier can have a structured surface and the structuring of the surface of the electrode can be conformal with respect to the structured surface of the carrier. In this case, a conformally formed electrode can be understood to mean a substantially plane-parallel reproduction of the structure of the carrier in the topography of the electrode. As a result, the structure of the carrier can be transferred to the topography of the surface of the electrode. By way of example, the electrode on the carrier can have a substantially constant layer thickness.

In various configurations, the structured surface of the carrier can have one or a plurality of features of the configurations of the structuring of the electrode as described below.

In various configurations, the electrode with structuring can be formed from a single layer. The electrode can be formed for example as a multilayered structure (layer structure) of different layers. The structuring of the electrode is formed from the layer structure, i.e. from a process of structuring the layer structure. Consequently, the structuring is not formed solely by means of applying to the electrode a substance or substance mixture that differs from the substance or substance mixture of the electrode. For example as in the case of a lift-off method in which a polymer layer is formed on a silver electrode.

In various configurations, the electrode may include a macrostructured region and a matrix region, wherein the macrostructured region in the reflective surface is surrounded by the matrix region in a planar fashion. The macrostructured region may include a plurality of non-continuous regions, for example include separated regions. The macrostructured region can be surrounded by a region having different optical properties.

Consequently, a matrix region should be understood to mean a planar region in which a macrostructured region is arranged. Illustratively, the macrostructured region is arranged in the area of the matrix region like particles in a matrix, but only relative to the distribution of the macrostructured regions in the matrix region in the reflective surface.

In various configurations, the macrostructured region can have a different structuring than the matrix region. The different structuring can lead for example to different optical properties, for example a different reflectivity and/or a different scattering cross section. As a result, the macrostructured region can be optically different than the matrix region.

In various configurations, the macrostructured region can be formed for representing information, for example in the form of lettering, a pictogram, an ideogram and/or a symbol. In other words, the macrostructured region can have a different structuring than the matrix region. The different structuring can lead for example to different optical properties, for example a different reflectivity and/or a different scattering cross section. As a result, the macrostructured region can be optically different than the matrix region. As a result, the macrostructured region can be formed for representing information, for example in the form of lettering, a pictogram, an ideogram and/or a symbol.

In various configurations, the structuring can be formed in such a way that the reflected electromagnetic radiation is reflected diffusely. As a result, it is possible to vary the scattering cross section of the reflected electromagnetic radiation at the interface of the reflective, structured surface of the electrode with the organic functional layer structure. As a result, for example, more light can be coupled out from an organic light emitting diode, or more electromagnetic radiation can be absorbed in a solar cell or a photodetector, for example by variation of the optical path length in the organic functional layer structure and/or variation of the angle of incidence of the electromagnetic radiation on the electromagnetic radiation absorbing regions in the organic functional layer structure.

In various configurations, the structuring can have a periodic arrangement of structures. The structure can also be referred to as a removed part of the electrode and be for example a hole, for example a blind hole; or a trench structure. The periodic arrangement can have for example a short-range or long-range order, for example a crystalline pattern having repeating spacings of structures that are adjacent alongside one another. A removed part can also be referred to as an at least partly opened part of the electrode. The structuring can be understood as the totality of the structures, for example as the totality of the holes, for example as an arrangement of holes, or include an arrangement of holes.

In various configurations, the structuring can have a random arrangement of structures, for example by virtue of the arrangement of the structures not being supervised during the process of forming the structures.

In various configurations, the structuring and the reflective surface may include or be formed from the same substance, for example by virtue of the reflective surface being formed by means of the structuring of the surface of the electrode.

In various configurations, the structuring can be formed as an arrangement of holes in the electrode or may include an arrangement of holes. In other words, the structuring can be formed by virtue of at least one part of the electrode having been removed.

In various configurations, the removed parts can be formed as holes in the electrode, for example as blind holes and/or trenches.

In various configurations, the holes can have a depth that is greater than $\frac{1}{10}$ of the wavelength of the reflected electromagnetic radiation, for example greater than half the wavelength of the reflected electromagnetic radiation. As a result, the structuring can lead to formation of an optical interference of the reflected electromagnetic radiation with the incident electromagnetic radiation.

In various configurations, the holes can have a depth that is greater than the coherence length of the coherent portion of the reflected electromagnetic radiation. As a result, it is possible to prevent the electromagnetic radiation that is reflected by different regions of the electrode from being able to be superimposed in an interfering fashion.

In various configurations, the holes can have a depth that is less than the coherence length of the coherent portion of the reflected electromagnetic radiation. This makes it possible that the electromagnetic radiation reflected by different regions of the electrode can be superimposed in an interfering fashion.

In various configurations, the structuring can be formed in such a way that the roughness of the reflective surface of the electrode is increased, for example with respect to the interface of the electrode with the carrier—for the case where the carrier is unstructured and the electrode is structured.

In various configurations, the structuring may include a mask structure in such a way that the mask structure forms a part of the reflective surface. As a result, one part of the electromagnetic radiation can be reflected by the electrode and another part of the electromagnetic radiation can be reflected by the mask structure. The mask structure can have for example a higher reflectivity than the electrode or some other effect described below.

In various configurations, the structured electrode may include holes in the electrode, wherein the mask structure is formed between the holes on the electrode.

In various configurations, the mask structure may include or be formed from a phosphor. The phosphor can for example absorb the reflected and/or transmitted electromagnetic radiation and re-emit it with a Stokes shift or an anti-Stokes shift of the wavelength of the electromagnetic radiation. As a result, it is possible to vary the optical properties of the optoelectronic component in the region with a mask structure, for example the color locus of emitted electromagnetic radiation. In various configurations, a phosphor may include or be formed from, for example, $Ce^{3+}$ doped garnets such as YAG:Ce and LuAG, for example (Y, Lu)$_3$(Al,Ga)$_5$O$_{12}$:Ce$^{3+}$; Eu$^{2+}$ doped nitrides, for example CaAlSiN$_3$:Eu$^{2+}$, (Ba,Sr)$_2$Si$_5$N$_8$:Eu$^{2+}$; Eu$^{2+}$ doped sulfides, SIONs, SiAlON, orthosilicates, for example (Ba,Sr,Ca)$_2$SiO$_4$:Eu$^{2+}$; chlorosilicates, chlorophosphates, BAM (barium magnesium aluminate:Eu) and/or SCAP, halophosphate.

In various configurations, the mask structure can be formed in an adhesion-reinforcing fashion with respect to the organic functional layer structure in relation to the reflective surface. By way of example, the mask structure can have a lower surface tension and/or a lower adhesion work than the reflective surface of the electrode and/or the layer of the organic functional layer structure which is in physical contact with the reflective surface of the electrode.

In various configurations, the electrode and the organic functional layer structure can be formed in such a way that they have different moduli of elasticity. As a result, the formation of thermal and/or mechanical strains can occur in the event of a change in the ambient temperature and/or mechanical loading of the optoelectronic component. The durability of the optoelectronic component can be reduced as a result.

In various configurations, the mask structure can be formed in a mechanically and/or thermally relaxing fashion with respect to the different moduli of elasticity of the reflective surface, of the layer of the organic functional layer structure arranged on the reflective surface and/or of the organic functional layer structure. As a result, the mask structure can contribute to a reduction of strains.

In various configurations, the optoelectronic component can be formed as an organic optoelectronic component.

In various configurations, the optoelectronic component can be formed as a surface component, i.e. may include a planar optically active region having at least one optically active side. A planar optically active region can be understood to mean a substantially two-dimensional spatial extent of the optoelectronic component, that is to say that one spatial extent is significantly smaller than at least two further spatial extents.

In various configurations, the optoelectronic component can be formed as a light emitting diode, a solar cell and/or a photodetector.

In various embodiments, a method for producing an optoelectronic component is provided, the method including: forming a structured electrode, forming an organic functional layer structure for emitting an electromagnetic radiation or converting an electromagnetic radiation into an electric current; wherein the structured electrode is formed with a surface which is reflective with respect to the electromagnetic radiation, and wherein the organic functional layer structure is formed on or over the reflective surface of the structured electrode and is electrically coupled thereto.

In various configurations of the method, the electrode may include or be formed from a metal.

In various configurations of the method, the method can furthermore include providing a carrier, wherein the electrode is formed on or over of the carrier.

In various configurations of the method, the carrier can have a structured surface and forming the structured electrode may include conformally forming the electrode on the structured surface of the carrier.

In various configurations, the structured surface of the carrier can be formed by one or a plurality of methods from the methods for structuring the electrode as described below.

In various configurations of the method, forming the structured electrode may include forming the electrode on the carrier and structuring the electrode.

In various configurations of the method, structuring the electrode may include a maskless lithographic method, for example laser writing or laser ablation. By way of example, regions can be removed from the electrode by said regions being evaporated or "blasted".

In various configurations of the method, structuring the electrode may include a photolithographic method.

In various configurations of the method, structuring the electrode may include an imprint lithographic method.

In various configurations of the method, structuring the electrode may include a nanoimprint lithographic method.

In various configurations of the method, structuring may include forming a mask structure on or over the electrode.

In various configurations of the method, forming the mask structure may include arranging particles on the electrode.

In various configurations of the method, the particles may include or be formed from a different substance than the electrode.

In various configurations of the method, the particles can be formed in such a way that they have a different etching rate than the substance or the substance mixture of the electrode with respect to an etching medium.

In various configurations of the method, the particles can be formed as magnetizable and forming the mask structure may include arranging the magnetizable particles in a magnetic field.

In various configurations of the method, the particles can be formed as electrically polarizable and forming the mask structure may include arranging the polarizable particles in an electric field.

In various configurations of the method, at least a first type of particles and a second type of particles can be arranged on the electrode.

In various configurations of the method, the first type of particles may include a different substance than the second type of particles.

In various configurations of the method, the first type of particles can have a different average diameter than the second type of particles.

In various configurations of the method, the first type of particles can be arranged in a different region on the electrode than the second type of particles.

In various configurations of the method, the particles can be arranged in a macrostructured region and a matrix region, wherein the macrostructured region in the reflective surface is surrounded by the matrix region in a planar fashion.

In various configurations of the method, in the macrostructured region on the electrode at least one different type of particles can be arranged, the particles can be processed in a different arrangement and/or the particles can be processed in a different way compared with in the matrix region.

In various configurations of the method, the mask structure can be formed in the macrostructured region in such a way that information is representable, for example in the form of lettering, a pictogram, an ideogram and/or a symbol.

In various configurations of the method, the particles can be applied in a periodic arrangement on the electrode and/or to the electrode.

In various configurations of the method, the particles can be applied in a random arrangement on the electrode and/or to the electrode.

In various configurations of the method, the particles can be arranged in a structured fashion after being applied to the electrode.

In various configurations of the method, the particles can be arranged in a structured fashion while being applied to the electrode.

In various configurations of the method, the particles can have an average diameter in a range of approximately 0.05 µm to approximately 100 µm.

In various configurations of the method, the particles may include or be formed from a substance from the group of the substances: for example as homopolymer or copolymer: a polystyrene, a polymethacrylate, a poly(N-isopropylacrylamide), a dextran, a polylactic acid, a silicate, a polyglucosamine, a polyethylenimine; gold, silver, platinum, copper, iron, iron oxide, magnesium, aluminum.

In various configurations of the method, the particles may include a core and a shell, wherein the core includes or is formed from a different substance or a different copolymer than the shell.

In various configurations of the method, the particles may include a magnetizable core.

In various configurations of the method, the particles may include an electrically polarizable core.

In various configurations of the method, the particles may include or be formed from a phosphor.

In various configurations of the method, the particles can be arranged in a monolayer on the electrode.

In various configurations of the method, the particles can be formed as adhesion-reinforcing with respect to the organic functional layer structure in relation to the reflective surface.

In various configurations of the method, the electrode and the organic functional layer structure can be formed in such a way that they have different moduli of elasticity.

In various configurations of the method, structuring may include forming a mask structure on or over the electrode, wherein forming the mask structure includes arranging particles on the electrode, and wherein the particles are formed as mechanically and/or thermally relaxing with respect to the different moduli of elasticity of the reflective surface, of the layer of the organic functional layer structure arranged on the reflective surface and/or of the organic functional layer structure.

In various configurations of the method, the average diameter of the particles can be reduced after being applied to the electrode, for example by means of increasing the temperature or by a plasma.

In various configurations of the method, the particles can be arranged in a macrostructured region and a matrix region, wherein the average diameter and/or the average spacing of the particles in the macrostructured region are/is varied in a different way than in the matrix region, for example by means of a different temperature and/or a different time when the temperature influences the particles in the macrostructured region. By way of example, it is possible to carry out a plasma treatment of the particles using a mask having mask openings. The mask can be formed in a manner correlated with the macrostructured region. By way of example, more plasma can impinge on the particles in the region of the mask opening.

In various configurations of the method, changing the temperature may include increasing the temperature in a range of approximately 10° C. to approximately 400° C.

In various configurations of the method, holes can be formed between the particles in the electrode by means of an etching medium, for example as blind holes.

In various configurations of the method, the etching medium can be designed as a solvent of the substance of the electrode, a plasma or a ballistic bombardment of the electrode.

In various configurations of the method, structuring may include forming holes in the electrode.

In various configurations of the method, the holes can be formed with a depth that is greater than 1/10 of the wavelength of the reflected electromagnetic radiation, for example is greater than half the reflected electromagnetic radiation.

In various configurations of the method, the holes can be formed with a depth that is greater than the coherence length of the coherent portion of the reflected electromagnetic radiation.

In various configurations of the method, the holes can be formed with a depth that is less than the coherence length of the coherent portion of the reflected electromagnetic radiation.

In various configurations of the method, the electrode can be structured in such a way that the roughness of the reflective surface of the electrode is increased, with respect to the interface of the electrode with the carrier.

In various configurations of the method, the mask structure can be removed after the process of structuring the electrode, such that the structuring and the reflective surface include or are formed from the same substance, or such that the structuring is formed as holes of the electrode or includes holes.

In various configurations of the method, the structured electrode can be formed from a single layer, for example by a layer being structured or being formed on a structured carrier.

In various configurations of the method, the organic functional layer structure can be formed on the structured electrode and the particles, wherein the particles and the structured electrode form the reflective surface. The remaining particles can form a mask structure, or can be designated as such, after the process of structuring the electrode.

In various configurations of the method, the electrode can be structured in such a way that the reflected electromagnetic radiation is reflected diffusely.

In various configurations of the method, the optoelectronic component can be formed as an organic optoelectronic component.

In various configurations of the method, the optoelectronic component can be formed as a surface component.

In various configurations of the method, the optoelectronic component can be formed as a light emitting diode, a solar cell and/or a photodetector.

BRIEF DESCRIPTION OF THE DRAWINGS

The invention is explained in greater detail below on the basis of an exemplary embodiment, wherein also as before no distinction will be drawn specifically among the claim categories and the features in the context of the independent claims are intended also to be disclosed in other combinations. In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 4A-4D show schematic illustrations of an optoelectronic component in the method for producing an optoelectronic component;

FIGS. 8A, and 8B show schematic illustrations of an optoelectronic component in accordance with various embodiments.

DETAILED DESCRIPTION

Figure 1:
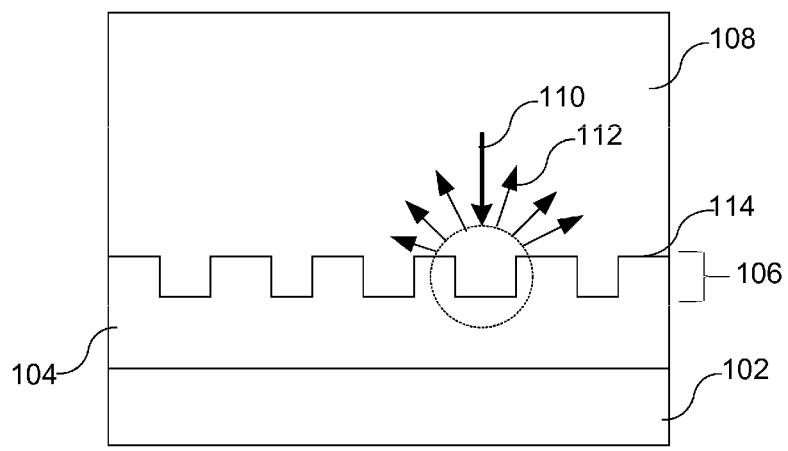
FIG. 1 shows a schematic illustration of a region of an optoelectronic component in accordance with various embodiments.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, optoelectronic components are described. Wherein an optoelectronic component includes an optically active region. The optically active region of an optoelectronic component can absorb electromagnetic radiation and form, i.e. convert, a photocurrent therefrom; or emit electromagnetic radiation to the optically active region by means of an applied voltage. In various embodiments, the electromagnetic radiation can have a wavelength range which includes X-ray radiation, UV radiation (A-C), visible light and/or infrared radiation (A-C).

Providing electromagnetic radiation can be understood to mean emitting electromagnetic radiation. In other words, providing electromagnetic radiation can be understood as emitting electromagnetic radiation by means of a voltage applied to an optically active region.

Taking up electromagnetic radiation can be understood to mean absorbing electromagnetic radiation. In other words: taking up electromagnetic radiation can be understood to mean absorbing electromagnetic radiation and forming a photocurrent from the absorbed electromagnetic radiation. In other words: absorbing electromagnetic radiation can be understood to mean converting electromagnetic radiation into an electrical current and/or an electrical voltage.

In various configurations, an electromagnetic radiation emitting structure can be an electromagnetic radiation emitting semiconductor structure and/or be formed as an electromagnetic radiation emitting diode, as an organic electromagnetic radiation emitting diode, as an electromagnetic radiation emitting transistor or as an organic electromagnetic radiation emitting transistor. The radiation can be for example light (in the visible range), UV radiation and/or infrared radiation. In this context, the electromagnetic radiation emitting component can be formed for example as a light emitting diode (LED), as an organic light emitting diode (OLED), as a light emitting transistor or as an organic light emitting transistor. In various configurations, the electromagnetic radiation emitting component can be part of an integrated circuit. Furthermore, a plurality of electromagnetic radiation emitting components can be provided, for example in a manner accommodated in a common housing.

In various embodiments, an optoelectronic structure can be formed as an organic light emitting diode (OLED), an organic field effect transistor (OFET) and/or an organic electronic system. The organic field effect transistor can be a so-called "all-OFET", in which all the layers are organic. An optoelectronic structure may include an organic functional layer system, which is synonymously also designated as organic functional layer structure. The organic functional layer structure may include or be formed from an organic substance or an organic substance mixture which is formed for example for providing an electromagnetic radiation from an electric current provided.

An optoelectronic component having an optically active region can have one or a plurality of optically active sides. A planar component having two planar optically active sides can be formed for example as transparent or translucent in the connection direction of the optically active sides. However, the optically active region can also have a planar optically active side and a planar optically inactive side, for example an organic light emitting diode formed as a top emitter or a bottom emitter. The optically inactive side can be provided for example with a mirror structure, for example a mirror structure having an electrically switchable reflectivity, and/or an opaque substance or substance mixture, for example for heat distribution; whereby the beam path of the component can be directed.

In various embodiments, an optoelectronic component is provided. The optoelectronic component can be formed as an organic optoelectronic component. Furthermore, the optoelectronic component can be formed as a surface component. Furthermore, the optoelectronic component can be formed as a light emitting diode, a solar cell and/or a photodetector. The optoelectronic component includes an electrode 104 and an organic functional layer structure 108 (illustrated in FIG. 1).

The organic functional layer structure 108 is formed for emitting an electromagnetic radiation or converting an electromagnetic radiation into an electric current.

A part of the electromagnetic radiation which was emitted or not absorbed by the organic functional layer structure 108 can be incident on the electrode 104 (illustrated by means of the arrow having the reference sign 110 in FIG. 1). The electrode 104 has, with respect to the incident electromagnetic radiation 110, a reflective surface 114 having a structuring 106. The structuring 106 can be formed in such a way that the electromagnetic radiation 110 incident on the structuring 106 is reflected diffusely (illustrated by means of the arrows having the reference sign 112 in FIG. 1).

The electrode 104 with structuring 106 can be formed from a single layer, for example a structured, electrically conductive layer. The structuring 106 can have a periodic and/or random arrangement of structures. The electrode 104 may include or be formed from a metal, for example transparent or opaque, for example as an anode or a cathode. Further embodiments of the electrode 104 are illustrated in the description of FIG. 2.

The organic functional layer structure 106 is formed on or over the reflective surface 114 of the electrode 104 and is electrically coupled thereto. Various embodiments of the organic functional layer structure 106 are illustrated in the description of FIG. 2.

The optoelectronic component can furthermore include a carrier 102, wherein the electrode 104 is formed on or over the carrier 102. The carrier 102 can be formed for example as a hermetically impermeable substrate.

Figure 2:
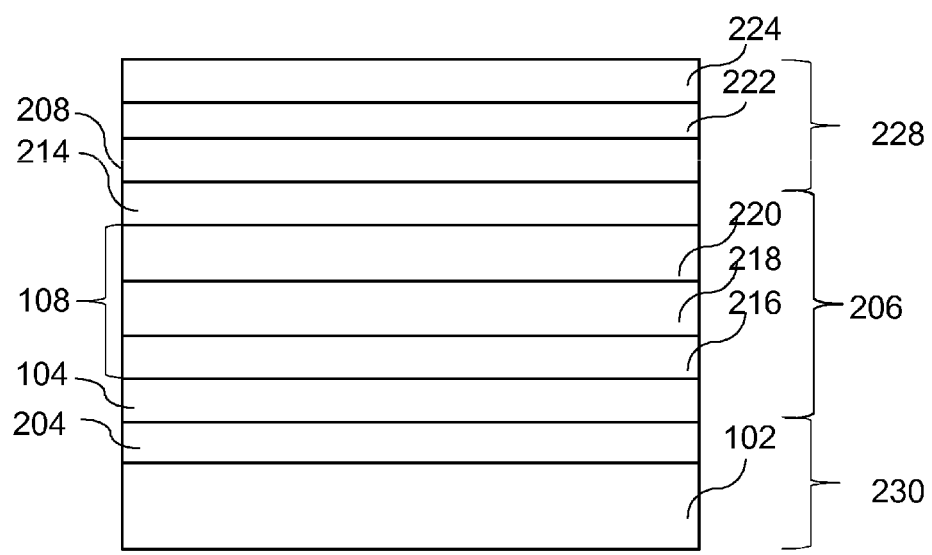
FIG. 2 shows a schematic illustration of an optoelectronic component in accordance with various embodiments.

Various embodiments of the carrier 102 are illustrated in the description of FIG. 2.

The optoelectronic component 200 (illustrated in FIG. 2) can be formed as an organic light emitting diode 200, an organic photodetector 200, or an organic solar cell.

An organic light emitting diode 200 can be formed as a top emitter or a bottom emitter. In the case of a bottom emitter, light is emitted from the electrically active region through the carrier. In the case of a top emitter, light is emitted from the top side of the electrically active region and not through the carrier.

A top emitter and/or bottom emitter can also be formed as optically transparent or optically translucent; by way of example, each of the layers or structures described below can be formed as transparent or translucent.

The optoelectronic component 200 includes a hermetically impermeable substrate 230, an active region 206 and an encapsulation structure 228.

The hermetically impermeable substrate 102 may include a carrier 102, a first barrier layer 204 and an intermediate structure 226.

The active region 206 is an electrically active region 206 and/or an optically active region 206. The active region 206 is for example the region of the optoelectronic component 200 in which electric current for the operation of the optoelectronic component 200 flows and/or in which electromagnetic radiation is generated and/or absorbed.

The electrically active region 206 may include a first electrode 104, an organic functional layer structure 108 and a second electrode 214.

The organic functional layer structure 206 may include one, two or more functional layer structure units and one, two or more intermediate layer structure(s) between the layer structure units. The organic functional layer structure 108 may include for example a first organic functional layer structure unit 216, an intermediate layer structure 218 and a second organic functional layer structure unit 220.

The encapsulation structure 228 may include a second barrier layer 208, a close connection layer 222 and a cover 224.

Figure 3:
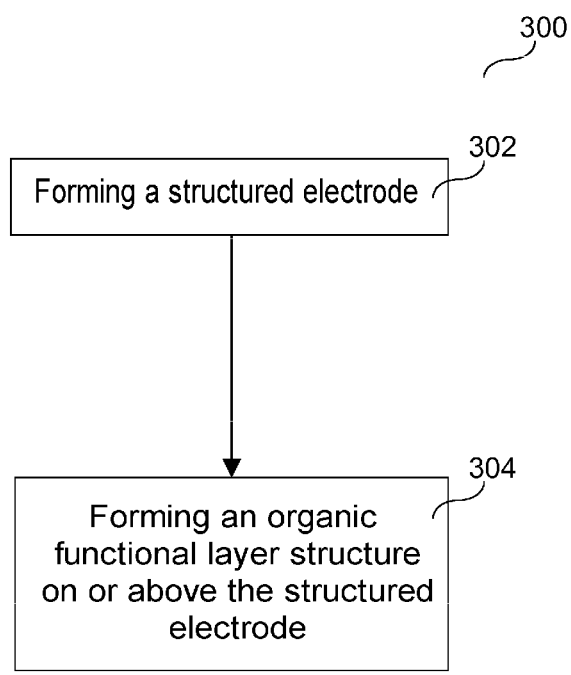
FIG. 3 shows an illustration concerning the method for producing an optoelectronic component in accordance with various embodiments.

Configurations of the intermediate structure are described in FIG. 2 and FIG. 3.

The carrier 102 may include or be formed from glass, quartz and/or a semiconductor material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 102 may include or be formed from a metal, for example copper, silver, gold, platinum, iron, for example a metal compound, for example steel.

The carrier 102 can be embodied as opaque, translucent or even transparent.

The carrier 102 can be a part of a mirror structure or form the latter.

The carrier 102 can have a mechanically rigid region and/or a mechanically flexible region or be formed in this way, for example as a film.

The carrier 102 can be formed as a waveguide for electromagnetic radiation, for example can be transparent or translucent with respect to the emitted or absorbed electromagnetic radiation of the optoelectronic component 200.

The first barrier layer 204 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenyleneterephthalamide), nylon 66, and mixtures and alloys thereof.

The first barrier layer 204 can be formed by means of one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by means of other suitable deposition methods.

In the case of a first barrier layer 204 including a plurality of partial layers, all the partial layers can be formed by means of an atomic layer deposition method. A layer sequence including only ALD layers can also be designated as a "nanolaminate".

In the case of a first barrier layer 204 including a plurality of partial layers, one or a plurality of partial layers of the first barrier layer 204 can be deposited by means of a different deposition method than an atomic layer deposition method, for example by means of a vapor deposition method.

The first barrier layer 204 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 204 may include one or a plurality of high refractive index materials, for example one or a plurality of materials having a high refractive index, for example having a refractive index of at least 2.

Furthermore, it should be pointed out that, in various embodiments, a first barrier layer 204 can also be entirely dispensed with, for example for the case where the carrier 102 is formed in a hermetically impermeable fashion, for example includes or is formed from glass, metal, metal oxide.

The first electrode 204 can be formed as an anode or as a cathode.

The first electrode 104 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 104 composed of a metal or including a metal may include or be formed from one of the following materials: Ag, Pt, Au, Mg, Al, Ba, In, Ca, Sm or Li, and compounds, combinations or alloys of these materials. The first electrode 104 may include as transparent conductive oxide one of the following materials: for example metal oxides: for example zinc oxide, tin oxide, cadmium oxide, titanium oxide, indium oxide, or indium tin oxide (ITO).

Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 104 may include a layer or a layer stack of a plurality of layers of the same material or different materials. The first electrode 104 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode 204 can have for example a layer thickness in a range of 10 nm to 500 nm, for example of less than 25 nm to 250 nm, for example of 50 nm to 100 nm.

The first electrode 104 can have a first electrical terminal, to which a first electrical potential can be applied. The first electrical potential can be provided by an energy source, for example a current source or a voltage source. Alternatively, the first electrical potential can be applied to an electrically conductive carrier 102 and the first electrode 104 can be electrically supplied indirectly through the carrier 102. The first electrical potential can be for example the ground potential or some other predefined reference potential.

FIG. 1 illustrates an optoelectronic component 200 including a first organic functional layer structure unit 216 and a second organic functional layer structure unit 220. In various embodiments, however, the organic functional layer structure 108 can also include more than two organic functional layer structures, for example 3, 4, 5, 6, 7, 8, 9, 10, or even more, for example 15 or more, for example 70.

The first organic functional layer structure unit 216 and the optionally further organic functional layer structures can be formed identically or differently, for example include an identical or different emitter material. The second organic functional layer structure unit 220, or the further organic functional layer structure units can be formed like one of the below-described configurations of the first organic functional layer structure unit 216.

The first organic functional layer structure unit 216 may include a hole injection layer, a hole transport layer, an emitter layer, an electron transport layer and an electron injection layer.

In an organic functional layer structure unit 108, one or a plurality of the layers mentioned can be provided, wherein identical layers can have a physical contact, can be only electrically connected to one another or can even be formed in a manner electrically insulated from one another, for example can be arranged alongside one another. Individual layers of the layers mentioned can be optional.

A hole injection layer can be formed on or over the first electrode 104.

The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); Spiro TPD (N,N'-bis(3-methylphenyl)-N,N'-bis(phenyl)benzidine); spiro-NPB (N,N'-bis(naphthalen-1-yl)-N,N'-bis(phenyl) spiro); DMFL-TPD N,N'-bis(3-methylphenyl)-N,N'-bis (phenyl)-9,9-dimethylfluorene); DMFL-NPB (N,N'-bis (naphthalen-1-yl)-N,N'-bis(phenyl)-9,9-dimethylfluorene); DPFL-TPD (N,N'-bis(3-methylphenyl)-N,N'-bis(phenyl)-9, 9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bis-napthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl)benzidine; 2,7-bis[N,N-bis(9,9-spirobifluoren-2-yl)amino)-9,9-spirobifluorene; 2,2'-bis[N,N-bis(biphenyl-4-yl)amino]9,9-spirobifluorene; 2,2'-bis(N,N-diphenylamino)9,9-spirobifluorene; di-[4-(N,N-ditolylamino)phenyl]cyclohexane; 2,2',7,7'-tetra(N,N-ditolyl)aminospirobifluorene; and/or N,N,N',N'-tetra-naphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or over the hole injection layer. The hole transport layer may include or be formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethyl-fluorene); DMFL-NPB (N,N'-bis(naphthalen-1-yl)-N,N'-bis(phenyl)-9, 9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9, 9-diphenylfluorene); spiro-TAD (2,2',7,7'-tetrakis(n,n-diphenylamino)-9,9'-spirobifluorene); 9,9-bis[4-(N,N-bisbiphenyl-4-ylamino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phen-anthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino] 9,9-spirobifluorene; 2,2'-bis(N,N-diphenylamino)9,9-spirobifluorene; di-[4-(N,N-ditolylamino)phenyl]cyclohexane; 2,2',7,7'-tetra(N,N-ditolyl)aminospirobifluorene; and N,N,N',N'-tetranaphthalen-2-ylbenzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or over the hole transport layer. Each of the organic functional layer structure units 216, 220 may include in each case one or a plurality of emitter layers, for example including fluorescent and/or phosphorescent emitters.

An emitter layer may include or be formed from organic polymers, organic oligomers, organic monomers, organic small, non-polymeric molecules ("small molecules") or a combination of these materials.

The optoelectronic component 200 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by means of thermal evaporation. Furthermore, polymer emitters can be used which can be deposited for example by means of a wet-chemical method, such as, for example, a spin coating method.

The emitter materials can be embedded in a suitable manner in a matrix material, for example a technical ceramic or a polymer, for example an epoxide; or a silicone.

In various embodiments, the emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 216 may include one or a plurality of emitter layers embodied as hole transport layer.

Furthermore, the organic functional layer structure unit 216 may include one or a plurality of emitter layers embodied as electron transport layer.

An electron transport layer can be formed, for example deposited, on or over the emitter layer.

The electron transport layer may include or be formed from one or a plurality of the following materials: NET-18; 2,2',2"-(1,3,5-benzinetriyl)tris(1-phenyl-1-H-benzimidazole); 2-(4-biphenylyl)-5-(4-tert-butyl-phenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethyl-fluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-naphthalen-2-yl)phenyl)-1H-imidazo[4,5-f] [1,10] phenanthroline; phenyldipyrenylphosphine oxide; naphthalenetetra-carboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or over the electron transport layer. The electron injection layer may include or be formed from one or a plurality of the following materials: NDN-26, MgAg, Cs$_2$CO$_3$, Cs$_3$PO$_4$, Na, Ca, K, Mg, Cs, Li, LiF; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis [2-(2,2'-bipyridin-6-yl)-1,3,4-oxadiazo-5-yl)benzene; 4,7- diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 108 including two or more organic functional layer structure units 216, 220, the second organic functional layer structure unit 220 can be formed above or alongside the first functional layer structure units 216. An intermediate layer structure 218 can be formed electrically between the organic functional layer structure units 216, 220.

In various embodiments, the intermediate layer structure 218 can be formed as an intermediate electrode 218, for example in accordance with one of the configurations of the first electrode 104. An intermediate electrode 218 can be electrically connected to an external voltage source. The external voltage source can provide a third electrical potential, for example at the intermediate electrode 218. However, the intermediate electrode 218 can also have no external electrical connection, for example by the intermediate electrode having a floating electrical potential.

In various embodiments, the intermediate layer structure 218 can be formed as a charge generating layer structure 218 (charge generation layer CGL). A charge generating layer structure 218 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 218 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 218 can furthermore have a diffusion barrier between adjacent layers.

Each organic functional layer structure unit 216, 220 can have for example a layer thickness of a maximum of approximately 3 µm, for example a layer thickness of a maximum of approximately 1 µm, for example a layer thickness of a maximum of approximately 300 nm.

The optoelectronic component 200 can optionally include further organic functional layers, for example arranged on or over the one or the plurality of emitter layers or on or over the electron transport layer(s). The further organic functional layers can be for example internal or external coupling-in/coupling-out structures that further improve the functionality and thus the efficiency of the optoelectronic component 200.

The second electrode 214 can be formed on or over the organic functional layer structure 108 or, if appropriate, on or over the one or the plurality of further organic functional layer structures and/or organic functional layers.

The second electrode 214 can be formed in accordance with one of the configurations of the first electrode 104, wherein the first electrode 104 and the second electrode 214 can be formed identically or differently. The second electrode 214 can be formed as an anode, that is to say as a hole-injecting electrode, or as a cathode, that is to say as an electron-injecting electrode.

The second electrode 214 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second barrier layer 208 can be formed on the second electrode 214.

The second barrier layer 208 can also be referred to as thin film encapsulation (TFE). The second barrier layer 208 can be formed in accordance with one of the configurations of the first barrier layer 204.

Furthermore, it should be pointed out that, in various embodiments, a second barrier layer 208 can also be entirely dispensed with. In such a configuration, the optoelectronic component 200 may include for example a further encapsulation structure, as a result of which a second barrier layer 208 can become optional, for example a cover 224, for example a cavity glass encapsulation or metallic encapsulation.

Furthermore, in various embodiments, in addition, one or a plurality of coupling-in/-out layers can also be formed in the optoelectronic component 200, for example an external coupling-out film on or over the carrier 102 (not illustrated) or an internal coupling-out layer (not illustrated) in the layer cross section of the optoelectronic component 200. The coupling-in/-out layer may include a matrix and scattering centers distributed therein, wherein the average refractive index of the coupling-in/-out layer is greater than the average refractive index of the layer from which the electromagnetic radiation is provided. Furthermore, in various embodiments, in addition, one or a plurality of antireflection layers (for example combined with the second barrier layer 208) can be provided in the optoelectronic component 200.

In various embodiments, a close connection layer 222, for example composed of an adhesive or a lacquer, can be provided on or over the second barrier layer 208. By means of the close connection layer 222, a cover 224 can be closely connected, for example adhesively bonded, on the second barrier layer 208.

A close connection layer 222 composed of a transparent material may include for example particles which scatter electromagnetic radiation, for example light-scattering particles. As a result, the close connection layer 222 can act as a scattering layer and lead to an improvement in the color angle distortion and the coupling-out efficiency.

The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close connection layer 222, for example air bubbles, acrylate, or hollow glass beads. Furthermore, by way of example, metallic nanoparticles, metals such as gold, silver, iron nanoparticles, or the like can be provided as light-scattering particles.

The close connection layer 222 can have a layer thickness of greater than 1 µm, for example a layer thickness of a plurality of µm. In various embodiments, the close connection layer 222 may include or be a lamination adhesive.

The close connection layer 222 can be designed in such a way that it includes an adhesive having a refractive index that is less than the refractive index of the cover 224. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 108, for example in a range of approximately 1.7 to approximately 2.0. Furthermore, a plurality of different adhesives can be provided which form an adhesive layer sequence.

In various embodiments, between the second electrode 214 and the close connection layer 222, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, a close connection layer 222 can be optional, for example if the cover 224 is formed directly on the second barrier layer 208, for example a cover 224 composed of glass that is formed by means of plasma spraying.

Furthermore, a so-called getter layer or getter structure, for example a laterally structured getter layer, can be arranged (not illustrated) on or over the electrically active region 206.

The getter layer may include or be formed from a material that absorbs and binds substances that are harmful to the electrically active region 206. A getter layer may include or be formed from a zeolite derivative, for example. The getter layer can be formed as translucent, transparent or opaque and/or non-transmissive with respect to the electromagnetic radiation that is emitted and/or absorbed in the optically active region.

The getter layer can have a layer thickness of greater than approximately 1 µm, for example a layer thickness of a plurality of µm.

In various embodiments, the getter layer may include a lamination adhesive or be embedded in the close connection layer 222.

A cover 224 can be formed on or over the close connection layer 222. The cover 224 can be closely connected to the electrically active region 206 by means of the close connection layer 222 and can protect said region from harmful substances. The cover 224 can be for example a glass cover 224, a metal film cover 224 or a sealed plastics film cover 224. The glass cover 224 can be closely connected to the second barrier layer 208 or the electrically active region 206 for example by means of frit bonding (glass frit bonding/glass soldering/seal glass bonding) by means of a conventional glass solder in the geometric edge regions of the organic optoelectronic component 200.

The cover 224 and/or the close connection layer 222 can have a refractive index (for example at a wavelength of 633 nm) of 1.55.

In various embodiments, a method 300 for producing an optoelectronic component is provided (illustrated in FIG. 3). The optoelectronic component can be formed as an organic optoelectronic component. The optoelectronic component can be formed as a surface component. The optoelectronic component can be formed as a light emitting diode, a solar cell and/or a photodetector.

The method 300 includes forming 302 a structured electrode. Forming 302 the structured electrode may include a maskless lithographic method, for example laser writing or laser ablation; a photolithographic method, an imprint lithographic method, and/or a nanoimprint lithographic method. The electrode can be structured in such a way that the electromagnetic radiation reflected by the electrode is reflected diffusely.

Furthermore, the method 300 includes forming 304 an organic functional layer structure on or over the structured electrode. The organic functional layer structure is formed for emitting an electromagnetic radiation or converting an electromagnetic radiation into an electric current, for example in accordance with one of the configurations described above.

The structured electrode is formed with a surface which is reflective with respect to the electromagnetic radiation. The organic functional layer structure is formed on or over the reflective surface of the structured electrode and is electrically coupled thereto.

In various configurations of the method 300, forming the structured electrode may include forming the electrode on the carrier and structuring the electrode (illustrated in FIGS. 4A-4D, FIG. 5 and FIG. 6).

An electrode 104 is formed on or over the carrier 102, (illustrated in FIG. 4A). The electrode may include or be formed from a metal, for example in accordance with one of the configurations from the description of FIG. 2, for example as a silver layer or an ITO layer.

In various configurations, structuring the electrode may include a maskless lithographic method, for example laser writing or laser ablation.

In various configurations, structuring the electrode may include a photolithographic method, an imprint lithographic method and/or a nanoimprint lithographic method. Structuring the electrode may include forming a mask structure on or over the electrode.

In various embodiments, forming the mask structure may include arranging particles 402 on the electrode 104, for example in a monolayer (illustrated in FIG. 4B).

The particles 402 can be formed in such a way that they include or are formed from a different substance than the electrode 104. The particles 402 can be formed in such a way that they have a different etching rate than the substance or the substance mixture of the electrode 104 with respect to an etching medium, for example a lower etching rate. The particles can be formed in such a way that they have a higher reflectivity and/or a greater difference in refractive index with respect to the organic functional layer structure than the electrode 104.

The particles 402 can be formed as magnetizable and forming the mask structure may include arranging the magnetizable particles 402 on the electrode 102 in a magnetic field.

The particles 402 can be formed as electrically polarizable and forming the mask structure may include arranging the polarizable particles 402 on the electrode 102 in an electric field.

The particles 402 can have an average diameter in a range of approximately 0.05 µm to approximately 100 µm. The particles 402 may include or be formed from one of the following substances: for example as a homopolymer or copolymer: a polystyrene, a polymethacrylate, a poly(N-isopropylacrylamide), a dextran, a polylactic acid, a silicate, a polyglucosamine, a polyethylenimine; gold, silver, platinum, copper, iron, iron oxide, magnesium, aluminum.

The particles 402 may include or be formed from a phosphor or electrically conductive substance, for example a dopant or phosphor of the organic functional layer structure in accordance with one of the configurations described above.

The particles 402 can be formed in such a way that they include a core and a shell, wherein the core includes or is formed from a different substance or a different copolymer than the shell. By way of example, the particles may include a magnetizable and/or electrically polarizable core.

The particles can be formed as adhesion-reinforcing with respect to the organic functional layer structure in relation to the reflective surface, for example can have a lower surface tension or adhesion work than the reflective surface of the electrode 104 and/or the layer of the organic functional layer structure which is in physical contact with the electrode or would be in physical contact without particles 402.

The electrode 104 and the organic functional layer structure formed on or over the electrode 104 can be formed in such a way that they have different moduli of elasticity. The mask structure on or over the electrode 104 can be formed such that the particles are mechanically and/or thermally relaxing with respect to the different moduli of elasticity of the reflective surface of the electrode 104, of the layer of the organic functional layer structure arranged on the reflective surface and/or of the organic functional layer structure.

In various configurations, the particles 402 can be applied in a periodic arrangement on the electrode 104 and/or to the electrode 104. The particles 402 can be arranged in structured fashion while being applied to the electrode 102.

In various configurations, the particles 402 can be applied in a random arrangement on the electrode 104 and/or to the electrode 104. The particles 402 can be arranged in a structured fashion after being applied to the electrode 102.

After the particles 402 have been arranged on the electrode 102, the average diameter and/or the average spacing of the particles 402 from one another can be varied; for example, the spacing can be increased and/or the average diameter can be decreased (illustrated by changed particles having the reference sign 404 in FIG. 4C). Changing the average diameter of the particles 402 can be carried out for example by means of changing the temperature, the pH (for the configuration where the particles are surrounded by a solution); the field strength and/or direction of an electric and/or magnetic field present, for example by means of increasing the temperature. Changing the temperature may include increasing the temperature in a range of approximately 10° C. to approximately 400° C.

Changing the average diameter of the particles 402 may include for example swelling, deswelling, shrinking, inflating or removing, for example dissolving or etching a part of the particles 402; or growing or depositing a part onto the particles 402.

In various configurations, the particles 402 can be processed in such a way that the particles 402 on the surface of the electrode change their shape, for example are melted and run (illustrated in FIG. 4D).

Interspaces 408 are formed at least locally between the particles 404, 406, the electrode 104 being exposed in said interspaces. Through the interspaces 408, holes 506 can be formed between the particles 404/406 in the electrode by means of an etching medium, for example as blind holes or a trench structure (illustrated in FIG. 5 and FIG. 6).

The etching medium can be a solvent of the substance of the electrode, a plasma or a ballistic bombardment of the electrode.

A ballistic bombardment of the exposed electrode 104 in the interspaces 408 can be for example a bombardment with particles, molecules, atoms, ions, electrons and/or photons.

A bombardment with photons can be formed for example as laser ablation with a wavelength in a range of approximately 200 nm to approximately 1700 nm, and can be formed for example in a focused manner, for example with a focus diameter in a range of approximately 10 µm to approximately 2000 µm, for example in a pulsed manner, for example with a pulse duration in a range of approximately 100 fs to approximately 0.5 ms, for example with a power of approximately 50 mW to approximately 1000 mW, for example with a power density of approximately 100 kW/cm$^2$ to approximately 10 GW/cm$^2$, and for example with a repetition rate in a range of approximately 100 Hz to approximately 1000 Hz.

The holes 504 can be formed with a depth that is greater than approximately 1/10 of the wavelength of the reflected electromagnetic radiation, for example with a depth of more than half the wavelength of the reflected electromagnetic radiation. For semitransparent optoelectronic components the holes 504 can have a depth that is less than 10% of the reflected electromagnetic radiation. The holes 504 can thus lead to a visible or measurable change in reflectivity of the structured electrode. The holes 504 can be formed with a depth that is greater or less than the coherence length of the coherent portion of the reflected electromagnetic radiation.

The electrode 104 can be structured in such a way that the roughness of the reflective surface of the electrode 104 is increased, for example with respect to the interface of the electrode 104 with the carrier 102.

Figure 5:
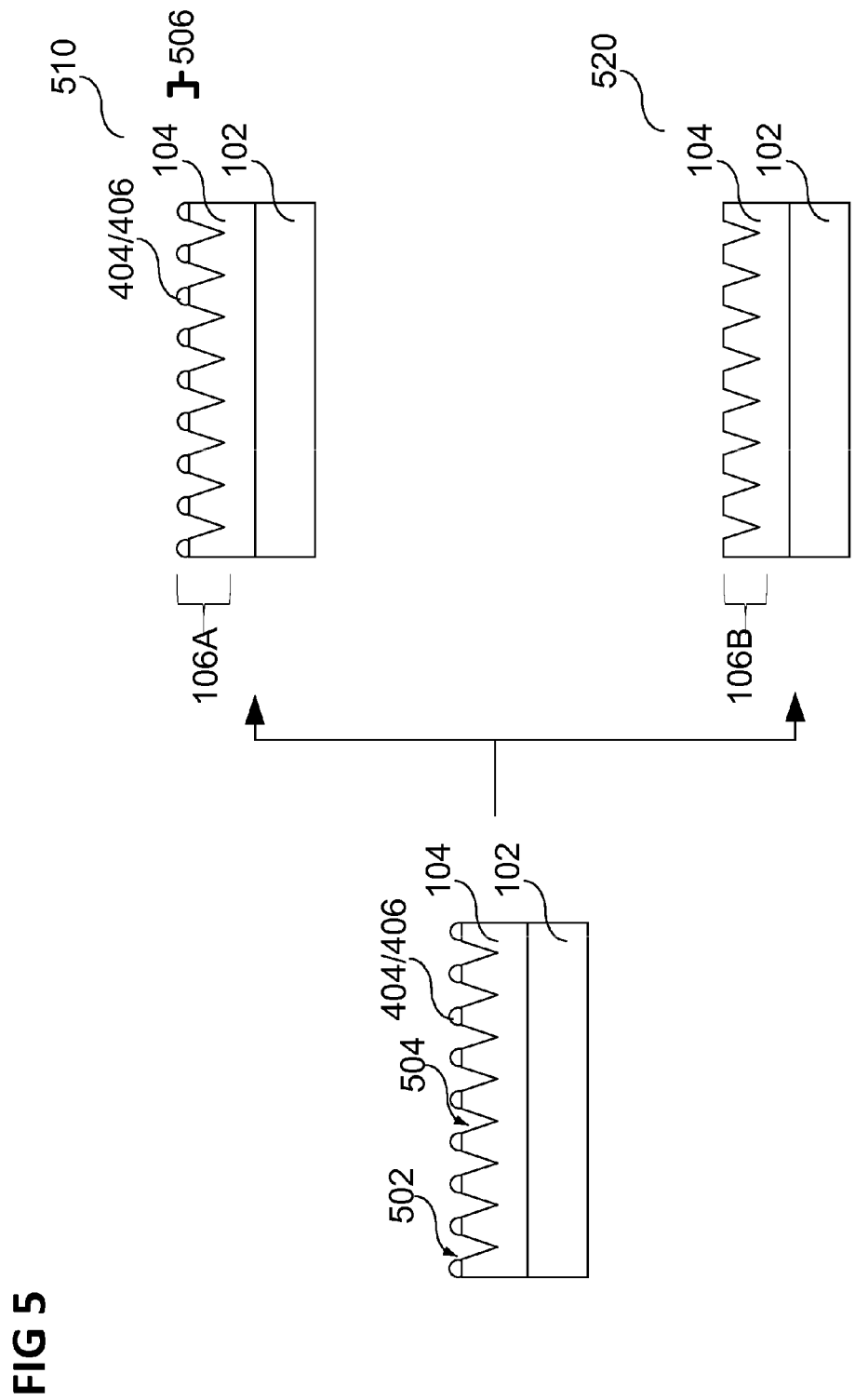
FIG. 5 shows a schematic illustration of an optoelectronic component in the method for producing an optoelectronic component.
Figure 6:
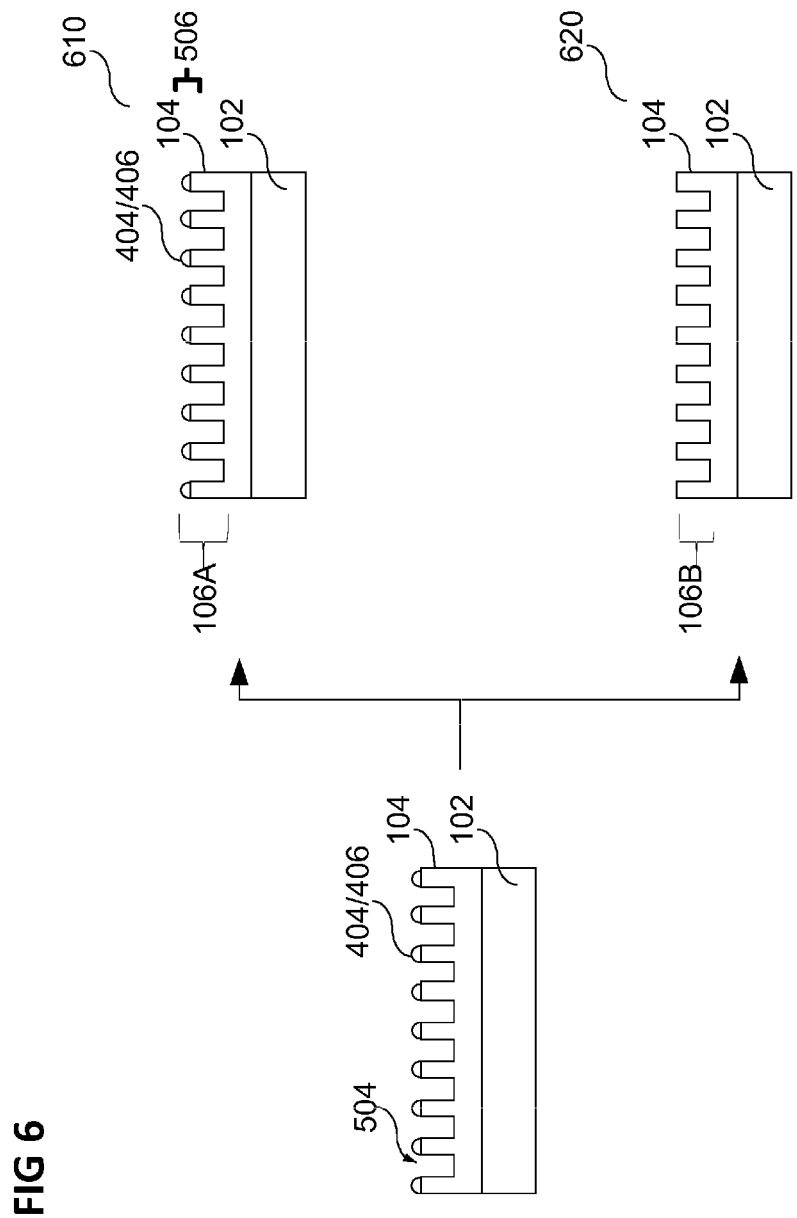
FIG. 6 shows a schematic illustration of an optoelectronic component in the method for producing an optoelectronic component.

The structuring 106 and the reflective surface 114 of the electrode 104 may include or be formed from the same substance (illustrated in FIG. 5 and FIG. 6).

In various embodiments, the structuring 106 can be formed as an arrangement of holes 504 in the electrode 104 (illustrated in FIG. 5 and FIG. 6 in the configurations having the reference signs 520 and 620, respectively, as structuring having the reference sign 106B). By way of example, the mask structure 506, for example the particles 404, 406, can be removed from the surface of the electrode 104 after the formation of the holes 504 in the electrode 104 or by means of the formation of the holes 504 in the electrode 104. As a result, the surface of the structured electrode can be substantially mask-free during the formation of the organic functional layer structure on the electrode 104. The structured region of the electrode 104 and the reflective surface include or are formed from the same substance.

In various embodiments, the structuring 106 can have holes (illustrated in FIG. 5 and FIG. 6 in the configurations having the reference signs 510 and 610, respectively, as structuring having the reference sign 106A). By way of example, the mask structure 506, for example the particles 404, 406, can remain on the surface of the electrode 104 after the formation of the holes 504 in the electrode 104. The structuring 106A of the electrode 104 may include a part of the mask structure 506 in such a way that the mask structure 506 forms a part of the reflective surface. The structured electrode 104 can have holes 504 in the electrode, i.e. in the electrode layer, wherein the mask structure 506, for example the particles 404/406, is formed and remains between the holes 504 on the electrode 104. The organic functional layer structure can be formed on the structured electrode and the particles, wherein the particles and the structured electrode form the reflective surface.

The holes 504 can be formed as holes and/or trenches in the electrode 104, for example as blind holes. The holes 504 can be formed isotropically (illustrated in FIG. 5) or anisotropically (illustrated in FIG. 6), for example with regard to their depth and/or shape.

Isotropically formed holes 504 can be formed for example by means of a wet-chemical etching method, for example wet-chemical etching of silver.

Anisotropically formed holes 504 can be formed for example by means of a dry-chemical etching method, for example dry-chemical etching of silver.

The holes 504 can have a depth that is greater than 1/10, for example greater than half, of the wavelength of the reflected electromagnetic radiation 112. In various embodiments, the holes 504 can have a depth that is greater or less than the coherence length of the coherent portion of the reflected electromagnetic radiation 112.

The structuring 106A,B can be formed in such a way that the roughness of the reflective surface 114 of the electrode 104 is increased, for example with respect to the interface of the electrode 104 with the carrier 102.

After the organic functional layer structure has been formed on the electrode, the mask structure 506 can have a functional effect. By way of example, the mask structure 506 may include or be formed from a phosphor with respect to the reflected or transmitted electromagnetic radiation. By way of example, the mask structure 506 can have an adhesion-reinforcing effect with respect to the organic functional layer structure in relation to the reflective surface of the electrode 104 without a mask structure 506. By way of example, the electrode and the organic functional layer structure can be formed in such a way that they have different moduli of elasticity. The mask structure 506 can then be formed as mechanically and/or thermally relaxing with respect to the different moduli of elasticity of the electrode 104 or, in the case of a multilayered electrode, the upper layers forming the reflective surface; the layer of the organic functional layer structure arranged on the reflective surface of the electrode 104 and/or the organic functional layer structure.

In various configurations, the structured electrode can be formed from a single layer.

During the formation of the holes 504, the particles 404/406 can be undercut (illustrated by means of the reference sign 502 in FIG. 5). As a result, the non-exposed region of the electrode 104—below the particles 404/406—is also structured. The scattering effect of the structuring 106 can be reinforced as a result.

Figure 7:
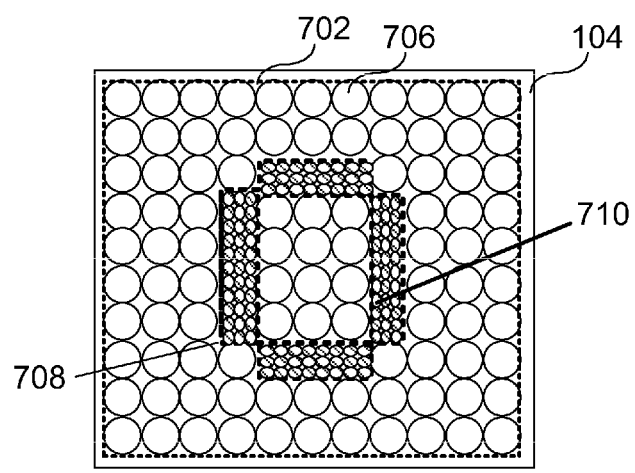
FIG. 7 shows a schematic illustration of an optoelectronic component in the method for producing an optoelectronic component in accordance with various embodiments.

In various embodiments, the electrode 104 may include a macrostructured region 708 and a matrix region 702, wherein the macrostructured region 708 in the reflective surface 114 of the electrode 104 is surrounded by the matrix region 702 in a planar fashion (illustrated in FIG. 7). The macrostructured region 708 can have a different structuring (106) than the matrix region 702. The macrostructured region 708 can be formed for representing information, for example in the form of lettering, a pictogram, an ideogram and/or a symbol.

In various embodiments, at least a first type of particles 706 and a second type of particles 710 can be arranged on the electrode 104. The first type of particles 706 can be arranged in a different region on the electrode than the second type of particles 710. By way of example, the first type of particles 706 can be arranged or formed in the matrix region 702 and the second type of particles 710 can be arranged or formed in the macrostructured region 708 (illustrated in FIG. 7). The first type of particles 706 may include a different substance than the second type of particles 710. The first type of particles 706 can have a different average diameter than the second type of particles 710.

In various configurations, the macrostructured region 710 and the matrix region 702 may include the same type of particles and/or can have the same arrangement of particles. For forming the representation of information, the average diameter of the particles in the macrostructured region 710 can be varied in a different way than in the matrix region 702, for example by means of a different temperature and/or a different time when the temperature influences the particles in the macrostructured region 710 compared with in the matrix region 702.

In other words, in the macrostructured region 708 on the electrode 104 at least one type of particles can be arranged, the particles can be processed in a different arrangement and/or the particles can be processed in a different way compared with in the matrix region 702. Further configurations of the particles are illustrated in the description of FIGS. 4A-4D.

In various embodiments, the carrier 102 can have a structured surface (illustrated in FIG. 8A). The structuring 106 of the surface of the electrode 102 can be formed conformally with respect to the structured surface of the carrier 102 (illustrated in FIG. 8B). In other words, forming the structured electrode in the method for producing an optoelectronic component may include conformally forming the electrode on the structured surface of the carrier.

Figure 9:
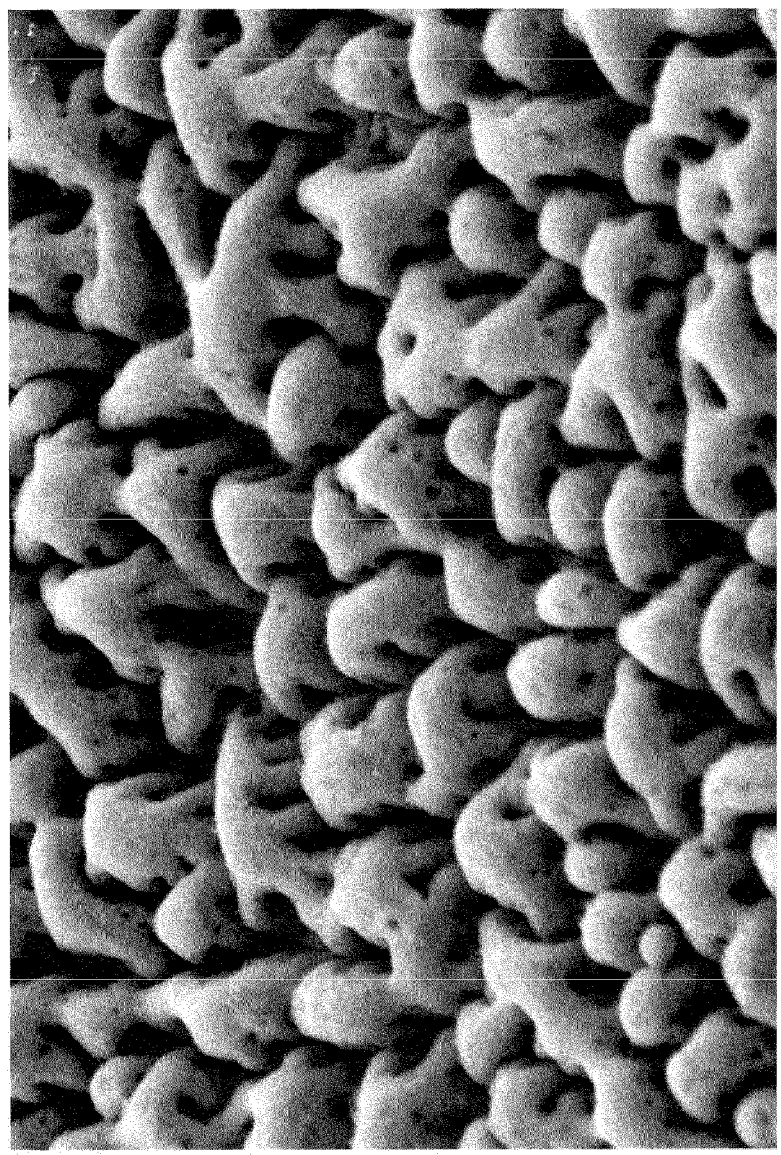
FIG. 9 shows a depiction of a carrier structured by means of the method.

In various configurations, the structured surface of the carrier 102 can have one or a plurality of features of the above-described configurations of the structuring of the electrode and/or be formed by one or a plurality of the above-described methods for structuring the electrode. FIG. 9 illustrates an SiC carrier 102 structured by means of the above-described method for structuring the electrode in a micrograph taken by an electron microscope.

In one embodiment, polysterol balls 402 are applied to the surface of the electrode 104, for example an anode. Said balls can be prepared in a monolayer on a water surface, for example, and can then be transferred to the surface of electrode the 104 by means of the electrode 104 being dipped into the water surface. After the drying of the water, the balls 402 can adhere on the surface of the electrode 104. By means of a thermal treatment step or a plasma step, the balls 402 can be reduced (404) in their diameter or be shaped as a meniscus 406 on the surface of the electrode 104. These structures can then act as a mask structure for subsequent etching processes, for example dry etching processes or wet etching processes. The balls 402 can then be removed before the subsequent layers are applied, for example before the organic functional layer structure is applied. A scattering effect arises by means of the structuring 106 of the electrode by means of the etching step. As a result, depending on the impingement location of the incident electromagnetic radiation, the angle of reflection of the reflected electromagnetic radiation can change in comparison with a non-structured electrode. As a result, the amount of absorbed electromagnetic radiation can be increased in the case of photodetectors or solar cells.

In the case of organic light emitting diodes, by means of the structuring of the electrode or substrate, the amount of electromagnetic radiation coupled out can be increased, for example in the case of a bottom emitter OLED including a structured transparent or translucent electrode—for example composed of ITO; in the case of a top emitter OLED including a structured reflective electrode—for example composed of silver, and/or in the case of a bidirectionally emissive OLED—which can be discerned from a milky appearance.

In various embodiments, an optoelectronic component and a method for producing an optoelectronic component are provided which make it possible to obtain an increased coupling-in of light and/or coupling-out of light for optoelectronic components, for example for organic light emitting diodes. Furthermore, as a result, the coupling-out can be formed before the organic functional layer structure, and thus early in the value creating process. If the coupling-out is not effective, it can be rejected with relatively low preceding financial outlay.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component comprising:
   a carrier having a substantially planar surface,
   an electrode on or above the carrier, wherein the electrode is a closed electrode layer and the electrode has an interface which is substantially conformal with respect to the surface of the carrier; and
   an organic functional layer structure formed for emitting an electromagnetic radiation or converting an electromagnetic radiation into an electric current;
   wherein the electrode has a surface which is reflective with respect to the electromagnetic radiation, and wherein the organic functional layer structure is formed on or over the reflective surface of the electrode and is electrically coupled thereto; and
   wherein the reflective surface has a structuring, wherein the structuring is formed as an arrangement of holes in the electrode or comprises holes and wherein the electrode with the structuring is formed from a single layer, and
   wherein the structuring comprises a mask structure in such a way that the mask structure forms a part of the reflective surface.

2. The optoelectronic component as claimed in claim 1, wherein the electrode comprises a macrostructured region and a matrix region, wherein the macrostructured region in the reflective surface is surrounded by the matrix region in a planar fashion, wherein the macrostructured region is formed for representing information.

3. The optoelectronic component as claimed in claim 2, wherein the information is represented in the form of lettering, a pictogram, an ideogram and/or a symbol.

4. The optoelectronic component as claimed in claim 1, wherein the holes have a depth that is greater than half the wavelength of the reflected electromagnetic radiation.

5. The optoelectronic component as claimed in claim 1, wherein the mask structure comprises or is formed from a phosphor.

6. The optoelectronic component as claimed in claim 1, wherein the optoelectronic component is formed as an organic optoelectronic component.

7. A method for producing an optoelectronic component, the method comprising:
   providing a carrier having a substantially planar surface,
   forming a structured electrode on or over the carrier,
   wherein the electrode is formed as a closed electrode layer, the electrode having an interface which is substantially conformal with respect to the surface of the carrier, and
   wherein the structuring of the electrode is formed as an arrangement of holes in the electrode or comprises holes and wherein the electrode with the structuring is formed from a single layer, and
   wherein forming the structured electrode comprises forming the electrode on the carrier and structuring the electrode, wherein structuring comprises forming a mask structure on or over the electrode wherein mask structure forms a part of the reflective surface;
   forming an organic functional layer structure for emitting an electromagnetic radiation or converting an electromagnetic radiation into an electric current;
   wherein the structured electrode is formed with a surface which is reflective with respect to the electromagnetic radiation, and
   wherein the organic functional layer structure is formed on or over the reflective surface of the structured electrode and is electrically coupled thereto.

8. The method as claimed in claim 7, wherein forming the mask structure comprises arranging particles on the electrode.

9. The method as claimed in claim 8, wherein at least a first type of particles and a second type of particles are arranged on the electrode.

10. The method as claimed in claim 8, wherein the particles are arranged in a monolayer on the electrode.

11. The method as claimed in claim 8, wherein the particles are arranged in a macrostructured region and a matrix region, wherein the average diameter and/or the average spacing of the particles in the macrostructured region is varied in a different way than in the matrix region.

12. The method as claimed in claim 11, wherein the average diameter and/or the average spacing of the particles is influenced by a thermal process and particles are processed in the macrostructured region using a different temperature and/or a different time than in the matrix region.

* * * * *